(12) United States Patent
Lee et al.

(10) Patent No.: US 6,365,518 B1
(45) Date of Patent: Apr. 2, 2002

(54) METHOD OF PROCESSING A SUBSTRATE IN A PROCESSING CHAMBER

(75) Inventors: Albert Lee, Santa Clara; Chris Ngai, Burlingame; Christopher Bencher, San Jose; Tom Nowak, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/818,361

(22) Filed: Mar. 26, 2001

(51) Int. Cl.[7] .............................................. H01L 21/44
(52) U.S. Cl. ....................... 438/687; 438/694; 438/913; 438/974; 118/59; 427/446; 427/569; 427/576; 427/579; 432/118; 219/338; 219/390
(58) Field of Search ................................ 438/687, 694, 438/913, 974; 118/59; 427/446, 569, 576, 579; 432/118; 219/388, 390

(56) References Cited

U.S. PATENT DOCUMENTS

| 5,492,854 A | * | 2/1996 | Ando | ........................... 437/60 |
| 6,129,044 A | | 10/2000 | Zhao et al. | |
| 6,136,725 A | | 10/2000 | Loan et al. | |
| 6,143,641 A | | 11/2000 | Kitch | |
| 6,147,000 A | | 11/2000 | You et al. | |

OTHER PUBLICATIONS

Yasushi Sawada, et al., "The reduction of copper oxide thin films with hydrogen plasma generated by an atmospheric--pressure glow discharge", J. Phys. D: Appl. Phys., 1996, pp. 2539–2544.

S. Hymes, et al., "Surface cleaning of copper by thermal and plasma treatment in reducing and inert ambients", J. Vac. Sci. Technol. B, May/Jun. 1998, pp. 1107–1109.

T. Takewaki, et al., "A novel self–aligned Surface–Silicide Passivation Technology for Relaibility Enhancement in Copper Interconnects", Symposium on VLSI Technology Digest of Technical Papers, 1995, pp. 31–32.

James D. Plummer, et al., Silicon VLSI Technology, 2000, pp. 561–563.

* cited by examiner

Primary Examiner—John F. Niebling
Assistant Examiner—David A. Zarneko
(74) Attorney, Agent, or Firm—Townsend & Townsend & Crew

(57) ABSTRACT

Methods for processing a substrate are disclosed. In one embodiment of the invention, a substrate with a first layer and an oxide layer on the substrate is placed in a processing chamber. The oxide layer is removed while the substrate is at a first temperature in the processing chamber. A second layer is then formed on the first layer while the substrate is at a second temperature in the processing chamber.

31 Claims, 3 Drawing Sheets

METHOD OF PROCESSING A SUBSTRATE IN A PROCESSING CHAMBER

BACKGROUND OF THE INVENTION

A typical semiconductor fabrication facility can cost billions of dollars. In view of the high capital costs associated with building and maintaining a semiconductor fabrication facility, it would be desirable to decrease the time needed to process semiconductor wafers into chips. By reducing the cycle time for chip production, more chips can be produced in less time, thus maximizing the use of equipment in a fabrication facility.

One time-consuming processing step in a chip manufacturing process is the evacuation and re-pressurization of processing chambers such as those found in many plasma processing apparatuses. For example, in a typical process for forming a silicon nitride layer on a copper conductor layer, a semiconductor substrate having a copper layer is placed in a first processing chamber in a first plasma processing apparatus. The first processing chamber is evacuated to low pressure and the copper oxide at the surface of the copper layer is removed while the semiconductor substrate is in the first processing chamber. After the copper oxide is removed, the first processing chamber is re-pressurized to atmospheric pressure and the semiconductor substrate is removed from the first processing chamber. The semiconductor substrate is then transferred to and is placed within a second processing chamber in a second plasma processing apparatus. Once the semiconductor substrate is in the second processing chamber, the second processing chamber is evacuated to low pressure. A silicon nitride layer is then formed on the surface of the copper layer while the semiconductor substrate is in the second processing chamber. After the silicon nitride barrier layer is formed on the copper layer, the second processing chamber is re-pressurized to atmospheric pressure and the semiconductor substrate is removed from the second processing chamber.

Sometimes, load-locks are used to transfer substrates into and out of a processing chamber. A substrate may be placed in a load-lock and the load-lock may be pumped down and re-pressurized prior to inserting the substrate into or taking a processed substrate out of a processing chamber. A typical load-lock houses a smaller space than a processing chamber and consequently takes less time to evacuate and re-pressurize.

A significant amount of time is needed to transfer the substrate between the first and second processing chambers, re-pressurize the processing chambers (or load-locks), and evacuate the processing chambers (or load-locks). It would be desirable to reduce the time associated with one or more of these steps to reduce the amount of time needed to process the substrate.

One way to reduce the processing time for semiconductor substrates is to use a cluster tool. Cluster tools have been used to reduce the time associated with evacuating and re-pressurizing different processing chambers. A typical cluster tool includes more than one processing chamber and a transfer chamber. Different processes can be performed on a single substrate in respectively different chambers without removing the substrate from a low pressure environment. In a typical cluster tool, a robot in the transfer chamber transfers a substrate from one chamber to another at low pressure. There is no need to evacuate or re-pressurize a chamber when inserting the substrate into the processing chamber or removing the substrate from the processing chamber.

Although cluster tools improve processing efficiency, it would still be desirable to further reduce the time associated with substrate processing. For example, while cluster tools reduce the time associated with evacuating and re-pressurizing different chambers, time is still needed to transfer the semiconductor substrate between the different processing chambers. Moreover, only one process per chamber is performed in a typical cluster tool, thus limiting the processing capacity of the cluster tool.

It would be desirable to reduce the amount of time associated with processing a substrate such as a semiconductor substrate. Embodiments of the invention address this and other problems.

SUMMARY OF THE INVENTION

Embodiments of the invention relate to methods for processing a substrate such as a semiconductor substrate.

One embodiment of the invention is directed to a method for processing a substrate in a processing chamber in a processing apparatus. The method comprises: (a) placing a substrate in the processing chamber, wherein a first layer comprising a conductive material and an oxide layer are on the substrate; (b) removing the oxide layer while the substrate is at a first temperature in the processing chamber; and (c) forming a second layer on the first layer while the substrate is at a second temperature in the processing chamber, wherein the second temperature is different than the first temperature.

Another embodiment of the invention is directed to a method for processing a substrate in a plasma processing apparatus. The method comprises: (a) forming a remote plasma outside of a processing chamber in the plasma processing apparatus; and (b) performing a first process on a substrate in the plasma processing chamber using the remote plasma; and (c) performing a second process on the substrate in the plasma processing chamber.

Another embodiment of the invention is directed to a method for processing a substrate in a processing chamber in a processing apparatus. The method comprises: (a) placing a substrate in the processing chamber; (b) performing a first process on a substrate in the processing chamber while the substrate is at a first temperature and is spaced from a pedestal comprising a heating or a cooling element; and (c) performing a second process on the substrate while the substrate is at a second temperature and is on the pedestal.

Another embodiment of the invention is directed to a method for processing a substrate in a processing chamber in a plasma processing apparatus. The method comprises: (a) placing a substrate in the processing chamber, wherein a conducting layer and an oxide layer are on the substrate; (b) removing the oxide layer while the substrate is at a first temperature and is disposed above a pedestal comprising a heating element; and (c) moving the substrate until the substrate contacts the pedestal at a second temperature that is higher than the first temperature; and (d) depositing a dielectric layer on the conducting layer.

These and other embodiments of the invention are described in detail below with reference to the Figures and the Detailed Description.

BRIEF DESCRIPTION OF THE DRAWINGS

In FIG. 2(a), a substrate is supported by pins during processing.

In FIG. 2(b), however, the substrate is supported by a pedestal.

DETAILED DESCRIPTION

Figure 1A:
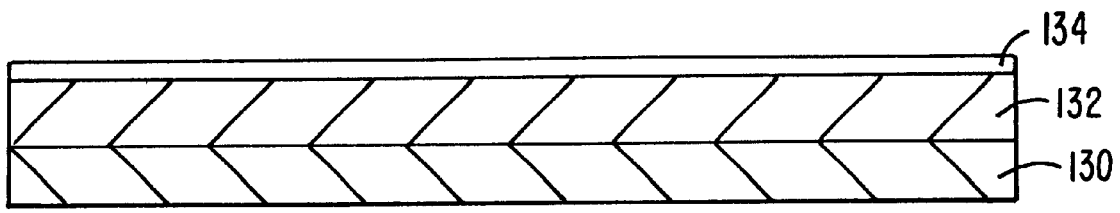
FIGS. 1(a)–1(c) are cross-sectional views of a portion of a substrate being processed according to an embodiment of the invention.
Figure 1B:
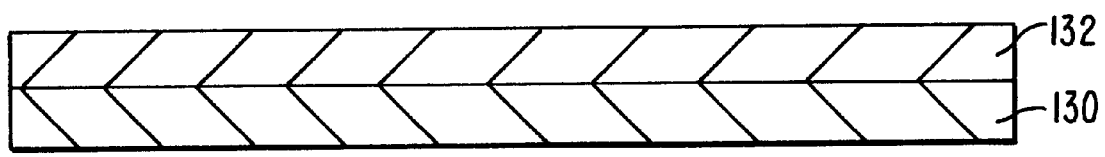

In embodiments of the invention, plural processes may be run in the same processing chamber. For example, first and second processes may be run back-to-back in the same processing chamber. The processing chamber is maintained at low pressure during the first and second processes and between the first and second processes. For example, in some embodiments, a first oxide removal process and a second deposition process may be performed on a semiconductor substrate in the same processing chamber. The processing chamber may be maintained at low pressure during the oxide removal process, the deposition process, and during the transition time between the oxide removal process and the deposition process.

In some embodiments of the invention, the first process performed on the substrate may be an oxide removal process. The oxide removal process may remove an oxide layer on a conductor layer on the substrate. For example, a first layer on a substrate may include a copper conductor layer with a copper oxide layer. The oxide layer on the conductor layer may have been formed by the prior oxidation of the upper surface of the conductor layer. An oxidizing material such as the oxygen in the air or an oxidizing material from a prior process such as a CMP (chemical mechanical polishing) process can oxidize a metal into its corresponding metal oxide.

During the first process, the substrate may be supported by pins that extend through a heated pedestal. When the substrate is on the pins, the substrate may be at a first temperature suitable for the oxide removal process. For example, the substrate may be at a temperature between about 100° C. and about 300° C., while the substrate is disposed on the pins. The heated pedestal may be at a second temperature that is suitable for a subsequent deposition process such as a PECVD (plasma enhanced chemical vapor deposition) process. For example, the pedestal may be at a temperature greater than about 350° C. After removing the oxide layer at the surface of the first layer, the substrate contacts the heated pedestal to heat the substrate to a second temperature. The second temperature may be suitable for performing a second process on the substrate. In embodiments of the invention, the pedestal or the pins may move so that the spacing between the substrate and the heated pedestal decreases until the substrate contacts the heated pedestal.

After the temperature of the substrate is at the second temperature, the second process may be performed on the substrate. The second process may be a deposition process such as a PECVD process that is used to form a dielectric layer on a previously processed conductor layer. The resulting product may comprise a dielectric layer or a barrier layer on the conducting layer without an intervening oxide layer. During both the first and the second processes, the heated pedestal can remain at the second temperature. Accordingly, processing time is not expended heating the pedestal to a desired process temperature.

Embodiments of the invention have a number of advantages. Since the substrate remains in the same chamber during and between both the first process and the second process, the processing chamber need not be re-pressurized and evacuated between these processes. Moreover, in embodiments of the invention, the substrate need not be transferred outside of the chamber to another chamber to have additional processing performed on the substrate. Consequently, the time associated with re-pressurizing a processing chamber, evacuating a processing chamber, and transferring a substrate between different processing chambers is reduced. Moreover, because two processes can be performed in the same plasma processing chamber, a processing chamber that might otherwise be used to perform one of the two processes can be used to process other substrates. As a result, the capacity of a manufacturing facility to process substrates is increased so that a greater number of substrates can be processed in the manufacturing facility.

More specific details regarding suitable processes and apparatuses that can be used in embodiments of the invention are provided below.

I. Processing a Substrate in a Processing Chamber

Any suitable number of processes and any suitable type of process may be performed in the same processing chamber. For example, a first process, a second process, and a third process may be performed in the same processing chamber. The temperatures of the substrate being processed may be different during each process. For instance, the temperature of the substrate while a first process is being performed may be lower or higher than the temperature of the substrate while the second process is being performed. The processes performed in the processing chamber may include: deposition processes such as CVD, PECVD, LPCVD, and sputtering; plasma etching processes; oxide removal processes; and substrate cleaning processes.

For purposes of illustration, embodiments of the invention including a) a first process comprising removing an oxide layer at the surface of a first layer on a substrate and b) a second process comprising forming a second layer on the first layer are described with reference to FIGS. 1(a)–1(c) and 2(a)–2(b).

Figure 2A:
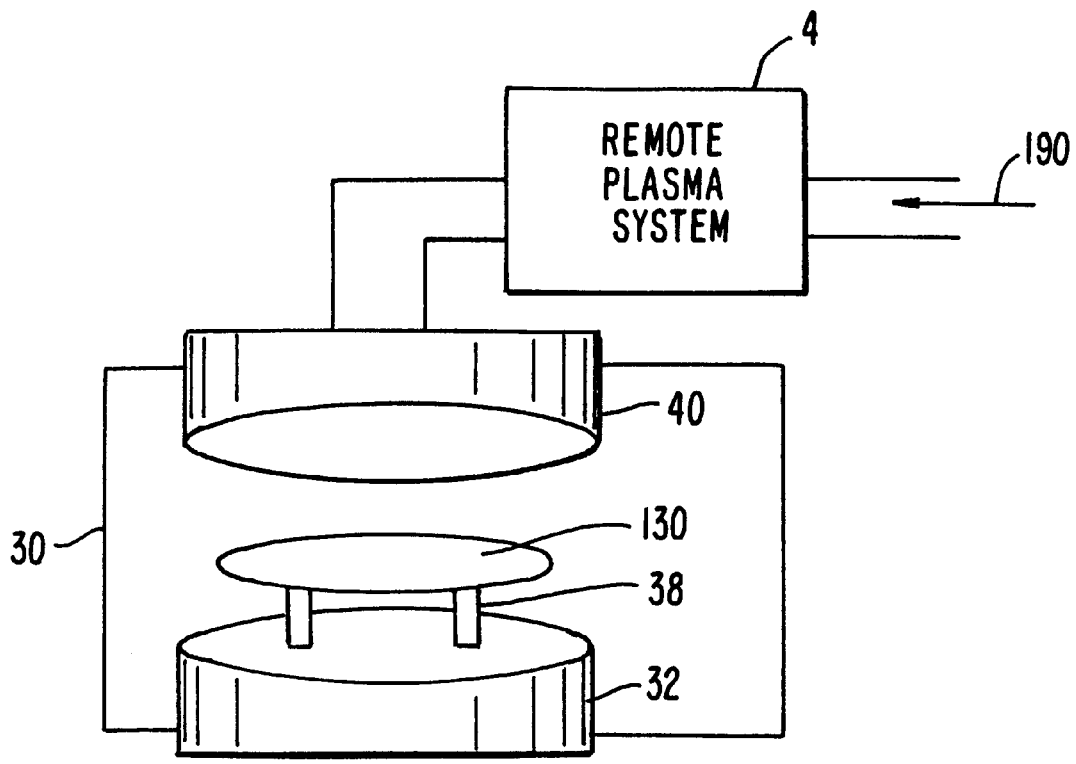
FIG. 2(a) is a simplified perspective view of some components of a plasma processing apparatus.
Figure 2B:
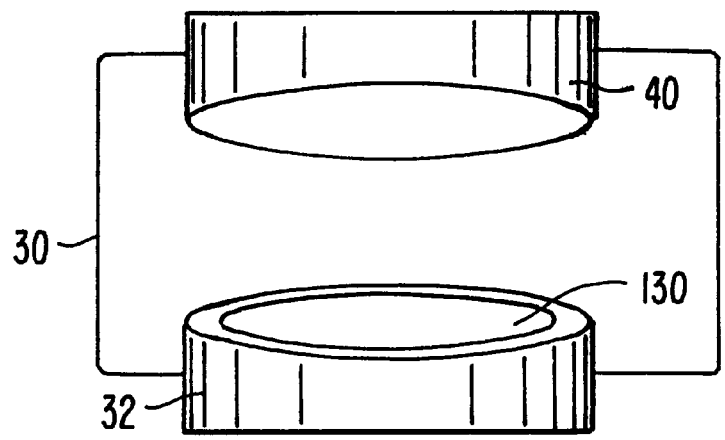
FIG. 2(b) is a simplified perspective view of some components of the plasma processing apparatus shown in FIG. 2(a).
Figure 3:
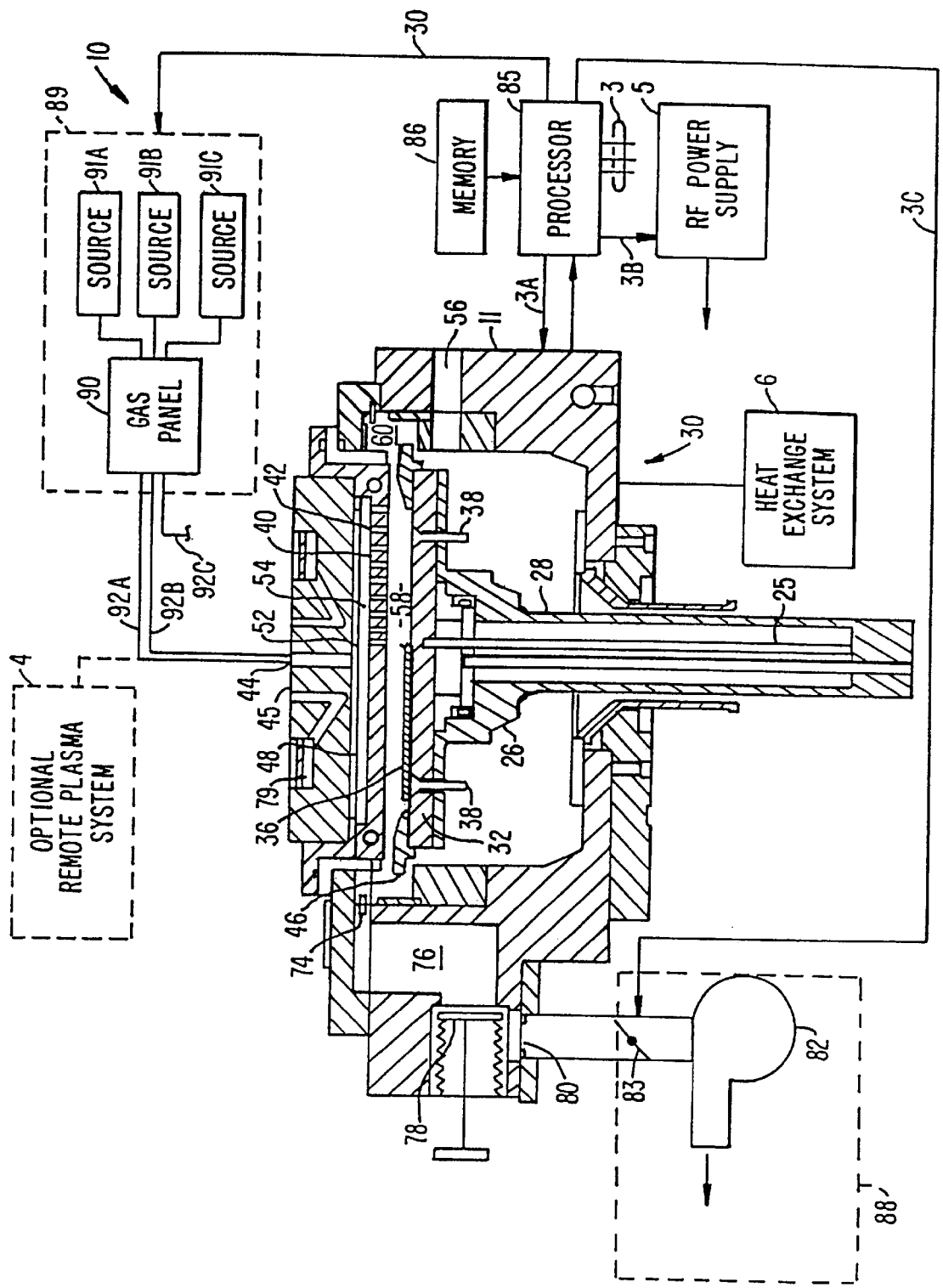
FIG. 3 is a simplified cross-sectional view of the plasma processing apparatus with some of the features of the apparatus represented by blocks.

Referring to FIGS. 1(a) and 2(a), a substrate 130 with a first layer 132 and an oxide layer 134 on the substrate 130 is placed in a processing chamber 30 of a PECVD apparatus. The first layer 132 may be, for example, a continuous layer of metal or metal lines or pads. In FIGS. 2(a)–2(b), the PECVD apparatus is greatly simplified, and a more detailed drawing of a typical PECVD apparatus is shown in FIG. 3 and is also described below.

The substrate 130 may comprise a semiconductor substrate such as a silicon wafer with or without additional layers of material on it. The first layer 132 may comprise a conductive material such as an oxidizable metal. Examples of oxidizable metals include copper, aluminum, chromium, tantalum, and the like. Using copper in the first layer 132 is desirable, because copper has a relatively low bulk resistivity compared to other metals such as aluminum. Using copper to form interconnects on a semiconductor chip increases the chip's operational speed compared to interconnects made from aluminum. Any suitable process may be used to form the first layer 132. For example, the first layer 132 may be formed by a CVD, PVD, PECVD, sputtering, electroplating, electroless plating, and the like.

The oxide layer 134 may be a metal oxide formed by the oxidation of metal in the first layer 132. As noted above, oxygen in the air or oxidizing agents from prior processes such as a CMP process can oxidize metal at the surface of the first layer 132 to form the oxide layer 134.

It is often desirable to remove an oxide layer at the surface of a conducting layer. For instance, a metal oxide layer between two conducting layers can impede the conduction between these layers. For example, copper oxide disposed between a copper conductor layer and an overlying solder layer can impede the conduction between these layers. An oxide layer can also decrease the adhesion between adjacent layers. For example, copper oxide disposed between a copper conductor layer and an overlying silicon nitride dielectric layer can reduce the adhesion between these layers.

Referring to FIG. 2(a), the substrate 130 may be placed on pins 38 that extend through a heated pedestal 32. The substrate 130 is in the processing chamber 30, which is evacuated to low pressure. Typically, the processing chamber 30 is evacuated to a pressure less than about 10 Torr (e.g., 5 Torr or less) during the oxide removal process. The processing chamber 30 may be maintained at this pressure during the oxide removal process, during the subsequent deposition process, and between these two processes.

Once in the processing chamber 30, a first process such as an oxide removal process is performed on the substrate 130 while the substrate 130 is disposed on the pins 38. Process gases 190 pass through a remote plasma system 4 and the process gases are ionized to form a plasma. The ionized gases then pass through the showerhead 40 to the substrate 130. The plasma removes the oxide layer 134 on the substrate 130 while the substrate 130 is disposed on the pins 38. After the oxide layer 134 is removed, the structure shown in FIG. 2(b) may be formed.

Any suitable oxide removal process may be used in embodiments of the invention including in-situ plasma processes. In some embodiments, a reducing gas is introduced to the processing chamber to reduce the oxidation state of the metal in the oxide layer and transform the oxide layer into metal. The reducing gas may be in the form of a plasma. When the plasma contacts the oxide layer 134, the plasma reduces the metal in the oxide layer 134.

Any suitable reducing gas composition may be used to remove the oxide layer 134. For example, the reducing gas composition may comprise a reducing gas such as $NH_3$ and an inert gas such as argon. In some embodiments, the ratio of the flowrates of the reducing gas to the inert gas may be about 1:20 or less. For example, the flowrate of $NH_3$ into the processing chamber 30 may be 300 sccm (standard cubic centimeters per minute) and the flowrate of argon into the processing chamber 30 may be about 7500 sccm. In another example, $H_2$ may be used as a reducing gas, alone or in combination with an inert gas. $H_2$ may be ionized to atomic hydrogen. Atomic hydrogen can reduce metal in a metal oxide such as copper oxide according to the following formula:

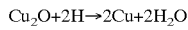

$$Cu_2O+2H \rightarrow 2Cu+2H_2O$$

In other embodiments, a substrate may be annealed in an $H_2$ atmosphere, without forming a plasma, to reduce metal in a metal oxide, thus removing the metal oxide. In another example, a gas such as silane may be used to reduce a metal in a metal oxide to its elemental form.

In other embodiments of the invention, the oxide layer may be removed by using a suitable plasma etch process. In a typical etch process, an etchant such as a halogen based etchant (e.g., $CF_4$) may be used. Regardless of the specific oxide removal process used in the first process, an end-point detector (not shown) in the processing apparatus can determine when all of oxide at the surface of the first layer is removed so that the oxide removal process can be terminated. Alternatively, the oxide removal process can be a timed process.

During the first process, the substrate 130 may be spaced from the heated pedestal 32 during the oxide removal process. In some embodiments, the substrate 130 may be spaced about 0.25 inches or more from the pedestal. For example, the substrate 130 may be spaced about 0.25 inches to about 1 inch from the pedestal 32. The heated pedestal 32 may also be spaced a distance of about 1 to about 2 inches from the showerhead 40 when the substrate 130 is supported by the pins 38.

When the substrate 130 is disposed on the pins 38, the substrate 130 can be maintained at a first temperature while the pedestal is kept at a second, substantially higher temperature. The first temperature may be less than about 350° C. For instance, the first temperature may be at about 200° C. to about 300° C. Because the substrate 130 is not being actively heated or cooled by the pedestal 32 when the substrate 130 is disposed on the pins 38, the first temperature may be substantially equal to the temperature of the interior of the processing chamber 30. The pedestal 32 may be at the second temperature that will be used for a subsequent process. For example, if a second process is to be performed at 400° C., the pedestal 32 may be at this temperature during the first process. Prior to performing the second process on the substrate 130, the substrate 130 may be disposed on the pedestal 32 to heat the substrate to 400° C.

The oxide removal process may be performed at low temperatures (e.g., less than about 350° C.). By performing the oxide removal process at a low temperature, the risk of undesired changes in the substrate 130 or the first layer 132 due to high temperatures is reduced. For example, when copper oxide is removed from a copper layer at 400° C., the temperature at which silicon nitride is formed, a number of "hillocks" can be formed in the copper layer. When a silicon nitride layer is formed on a hillock-containing copper layer, the resulting silicon nitride layer may be uneven. Layers, such as dielectric layers, that are formed on the uneven silicon nitride layer may also be uneven, thus potentially resulting in defects in the formed circuit structure.

If a plasma process is used in the first process, a remote plasma can be used to form the plasma that processes the substrate 130. For example, a remote plasma can be used to ionize a reducing gas. The plasma is remote, since it is formed outside of the processing chamber. In some instances, the plasma may be formed in a main delivery channel to a processing chamber in a plasma processing apparatus. Microwave power may be supplied to process gases within the main delivery channel to form a plasma in the main delivery channel. The ionized gas can then be delivered into a processing chamber and to the substrate to process the substrate. By using a remote plasma, the likelihood of potential arcing in the region between the substrate and the heated pedestal 32 is reduced. When a remote plasma is formed, the power used to form the plasma is supplied to a region of the apparatus outside of the processing chamber.

In embodiments of the invention, the plasma used to process the substrate may be formed in any suitable manner. For example, the plasma may be formed by: (1) forming a plasma in the processing chamber (i.e., at low or high power) without forming a plasma outside of the processing chamber; (2) forming a plasma outside of the processing chamber without forming a plasma in the processing chamber; and (3) forming a plasma in the processing chamber and outside of the processing chamber. With regard to (3), ions may be formed from gases in a delivery channel outside of the processing chamber and low power (e.g., power that is less than about 30% of the maximum power that can be applied) may be applied to the processing chamber to form ions within plasma processing chamber. Ions in both of these regions of the apparatus may be used to process the substrate in the first process. By adjusting the power and other process parameters such as gas flow rates and pressures, unintended arcing in the processing chamber can be minimized to reduce the likelihood of potentially affecting circuits that might be present on the substrate.

After the oxide removal process is completed, the temperature of the substrate 130 may be heated or cooled to a second temperature. The second temperature may be suitable for performing the second process on the substrate 130. In some embodiments, the second temperature may be about 350° C. or more. Typically, the difference between the substrate temperature used in the first process and the substrate temperature used in the second process is about 50° C. or more.

The temperature of the substrate 130 may be changed from the first substrate temperature to the second substrate temperature in any suitable manner. In some embodiments, the temperature of the substrate may be changed by increasing or decreasing the distance of the substrate from a heated or cooled pedestal. For example, referring to FIG. 2(b), the pins 38 and/or the heated pedestal 32 can move so that the heated pedestal 32 supports and contacts the substrate 130 instead of the pins 38. Once the substrate 130 is in contact with the heated pedestal 32, the heated pedestal 32 can heat the substrate 130 to a desired temperature for a second process such as a CVD process. During both processes, the heated pedestal 32 may be maintained at a single temperature (e.g., 400° C.). In other embodiments, a substrate may be present on the pedestal during a first process to maintain the substrate at a first temperature. The spacing between the pedestal and the substrate may then be increased. For example, the pedestal may be lowered so that the substrate is supported by pins extending from the pedestal. The substrate may then be maintained at a second temperature suitable for a second process while the substrate is on the pins.

Advantageously, by changing the temperature of the substrate 130 by increasing or decreasing the spacing between the substrate 130 and the pedestal 32, the temperature of the substrate 130 can be changed quickly with minimal handling of the substrate 130 between processes. The pedestal 32 can be kept at a substantially constant temperature from the first process to the second process, thus reducing the processing time associated with the heating and cooling of the pedestal 32 between processes. In some instances, heating or cooling a pedestal from a first temperature to a second temperature may take 15 minutes or longer. Also, the substrate 130 can be moved a short distance to change the temperature of the substrate 130. There is no need to re-pressurize a chamber, remove the substrate from the chamber, place a substrate in another chamber, and evacuate that chamber. The time associated with these additional steps are reduced or eliminated, thus increasing processing efficiency.

In alternative embodiments, the temperature of the substrate 130 can be maintained or changed without using pins 38. For example, heating and cooling fluids may be supplied to the pedestal 32. The heating and cooling fluids may heat and/or cool the pedestal 32 as needed to heat or cool the substrate 130 for the different processes being performed in the processing chamber.

In some embodiments, an inert gas such as nitrogen or argon flows into the processing chamber 30 to stabilize the pressure in the processing chamber 30. This can be done before the process gases for the second process are introduced into the processing chamber 30 and before a plasma is formed from the process gases used in the second process. For example, after the first process is completed, nitrogen may flow into the processing chamber 30 at a rate of about 5000 sccm for about 5 to 10 seconds before the process gases for the second process begin to flow to the processing chamber 30. After the inert gas flows into the processing chamber 30, but before the process gases for the second process flow towards the processing chamber 30, a plasma may be formed from the inert gas. The inert gas plasma may be formed in the processing chamber 30 and/or outside of the processing chamber 30. Then, the process gases for the second process flow towards the process chamber 30. The process gases may be ionized in the processing chamber 30 to form a plasma that processes the substrate 130. By forming a plasma in this manner, the likelihood of forming copper silicide at the surface of a copper conducting layer is reduced. Sometimes, copper silicide can form on a copper conductor layer when a silicon nitride layer is formed on the copper conducting layer using a plasma containing silane, without first forming an inert gas plasma in the processing chamber 30.

Figure 1C:
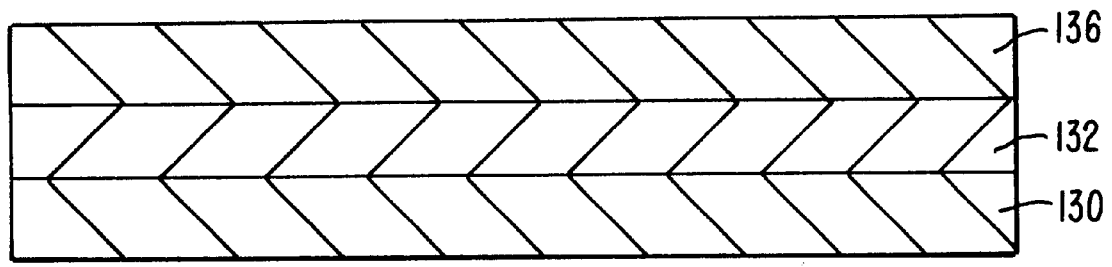

Referring to FIGS. 1(c) and 2(b), after the oxide layer 134 on the first layer 132 is removed, a second layer 136 may be formed on the first layer 132. This may be done while the substrate 130 is at the second substrate temperature. As noted, the second substrate temperature may be, for example, at least about 50° C. higher than the first substrate temperature used in the first process. During the formation of the second layer 136, the substrate may be disposed on the pedestal 32 as shown in FIG. 2(b). The second layer 136 may also be formed in the same processing chamber 30 where the prior oxide removal process was performed.

The second process may be a deposition process such as a CVD process, PECVD process, sputtering process, and the like. In some embodiments, the second process may be used to deposit a variety of films including films for intermetal dielectric (IMD) applications and premetal dielectric (PMD) applications. The formed films may be based on TEOS (tetraethylorthosilicate) or silane based PECVD and SACVD (subatmospheric CVD) chemistries. Materials such as undoped silicon oxide (USG) and doped silicon oxides such as boron phosphorus silicate glass (BPSG), phosphorus silicate glass (PSG) and fluorine-doped silicate glass (FSG), silicon nitride ($Si_3N_4$), silicon carbide, siliconoxynitrides (e.g., $SiO_xN_y$, x, y=0 to 1, SiON:H), amorphous silicon and other materials may be in the formed second layer 136.

In some embodiments, the second layer may be a barrier layer on a conducting layer. Barrier layers typically encapsulate a conductor layer to prevent diffusion between the conductor layer and an overlying or an underlying dielectric layer (e.g., a polymeric dielectric layer). The barrier layer may comprise a material such as silicon, tantalum, titanium, and tungsten nitrides. Metals such as tantalum, titanium, and tungsten may also be used as a barrier layer. In other embodiments, the second process may be used to deposit an adhesion layer metal such as chromium, an interconnection metal such as solder, or a contact metal such as gold.

In some embodiments, the second layer 136 comprises silicon nitride. Silicon nitride can be formed using, for example, a PECVD or a LPCVD process using process gases such as silane ($SiH_4$), nitrogen ($N_2$), ammonia ($NH_4$), dichlorosilane ($SiH_2Cl_2$), and other gases. Silicon nitride may be used as a passivation film, a barrier layer, or a dielectric layer that is disposed on an underlying conducting layer. In typical PECVD process for forming a nitride, the substrate is heated to a temperature of about 200° C. to about 400° C., or more.

Embodiments of the invention provide a number of advantages. For example, in embodiments of the invention, two processes that require different optimal processing temperatures can be run back-to-back in the same chamber without the need to heat or cool down the chamber between processes. This allows for greater throughput while using optimum process recipes between processes. Moreover, in embodiments of the invention, one plasma processing apparatus can be used to perform two or more processes. The use of each processing apparatus in a manufacturing facility can be maximized, thus improving throughput.

II. Processing Apparatuses

Embodiments of the invention may be performed in the processing chamber of any suitable processing apparatus. Suitable processing apparatuses include plasma etching apparatuses, and deposition apparatuses such as PVD (physical vapor deposition), CVD (chemical vapor deposition), and PECVD apparatuses. In a PECVD apparatus, process gases are excited and/or dissociated by the application of energy such as radio frequency (RF) energy to form a plasma. The plasma contains ions of the process gases and reacts at the surface of the substrate to form a layer of material.

An example of a PECVD apparatus is shown in FIG. 3. FIG. 3 shows a system 10 including a processing chamber 30, a vacuum system 88, a gas delivery system 89, an RF power supply 5, a heat exchange system 6, a pedestal 32 and a processor 85 among other major components. A gas distribution manifold (also referred to as an inlet manifold and as a "showerhead") 40 introduces process gases supplied from the gas delivery system 89 into a reaction zone 58 of the processing chamber 30. The heat exchange system 6 may employ a liquid heat exchange medium, such as water or a water-glycol mixture, to remove heat from the processing chamber 30 and maintain certain portions of the processing chamber 30 at a suitable temperature.

The gas delivery system 89 delivers gases to the processing chamber 30 via gas lines 92A–C. The gas delivery system 89 includes a gas supply panel 90 and gas or liquid or solid sources 91A–C (additional sources may be added if desired), containing gases (such as $SiH_4$, ozone, halogenated gases, or $N_2$) or liquids (such as TEOS) or solids. The gas supply panel 90 has a mixing system that receives the process gases and carrier gases (or vaporized liquids) from the sources 91A–C. Process gases may be mixed and sent to a central gas inlet 44 in a gas feed cover plate 45 via the supply lines 92A–C (other lines may be present, but are not shown).

Process gas is injected into processing chamber 30 through the central gas inlet 44 in the gas-feed cover plate 45 to a first disk-shaped space 48. Heat exchange passages 79 may be provided in the cover plate 45 to maintain the cover plate 45 at a desired temperature. The process gas passes through passageways (not shown) in a baffle plate (or gas blocker plate) 52 to a second disk-shaped space 54 and then to the showerhead 40. The showerhead 40 includes a large number of holes or passageways 42 for supplying the process gas into reaction zone 58. Process gas passes from the holes 42 in the showerhead 40 into the reaction zone 58 between the showerhead 40 and the pedestal 32. Once in the reaction zone 58, the process gas reacts on the wafer 36. Byproducts of the reaction then flow radially outward across the edge of the wafer 36 and a flow restrictor ring 46, which is disposed on the upper periphery of pedestal 32. Then, the process gas flows through a choke aperture formed between the bottom of an annular isolator and the top of chamber wall liner assembly 53 into a pumping channel 60.

The vacuum system 88 maintains a specified pressure in the process chamber 30 and removes gaseous byproducts and spent gases from the process chamber 30. The vacuum system 88 includes a vacuum pump 82 and a throttle valve 83. Upon entering the pumping channel 60, the exhaust gas is routed around the perimeter of the processing chamber 30, and is evacuated by a vacuum pump 82. The pumping channel 60 is connected through the exhaust aperture 74 to a pumping plenum 76. The exhaust aperture 74 restricts the flow between the pumping channel 60 and the pumping plenum 76. A valve 78 gates the exhaust through an exhaust vent 80 to the vacuum pump 82.

The pedestal 32 may be made of ceramic and may include an embedded RF electrode (not shown), such as an embedded molybdenum mesh. A heating element such as a resistive heating element (e.g., an embedded molybdenum wire coil) or a coil containing a heating fluid may also be in the pedestal 32. Alternatively or additionally, a cooling element (not shown) may be included in the pedestal 32. The pedestal 32 may be made from aluminum nitride and is preferably diffusion bonded to a ceramic support stem 26 that is secured to a water cooled aluminum shaft 28 that engages a lift motor (not shown). The ceramic support stem 26 and the aluminum shaft 28 have a central passage that is occupied by a nickel rod 25 that transmits low frequency RF power to the embedded electrode.

The pedestal 32 may support the wafer 36 in a wafer pocket 34 when the wafer 36 is on the pedestal 32. The pedestal 32 may move vertically and may be positioned at any suitable vertical position. For example, when the pedestal 32 is in a lower loading position (slightly lower than at slit valve 56), a robot blade (not shown) in cooperation with the lift pins 38 and a lifting ring transfers the wafer 36 in and out of chamber 30 through a slit valve 56. The slit valve 56 vacuum-seals the processing chamber 30 to prevent the flow of gas into or out of the processing chamber 30. When the pedestal 32 is disposed in a lower position, the lift pins 38 (which may be stationary) support the wafer 36. The robot blade (not shown) used to transfer the wafer 36 into the chamber is withdrawn. The wafer 36 may remain on the lift pins 38 so that the wafer 36 can be processed according to the first process. The pedestal 32 may rise to raise the wafer 36 off the lift pins 38 onto the upper surface of the pedestal 32 so that the wafer 36 can be heated to a second temperature suitable for a second process. The pedestal 32 may further raise the wafer 36 so that the wafer 36 is any suitable distance from the gas distribution manifold 40.

Motors and optical sensors (not shown) may be used to move and determine the position of movable mechanical assemblies such as the throttle valve 83 and the pedestal 32. Bellows (not shown) attached to the bottom of the pedestal 32 and the chamber body 11 form a movable gas-tight seal around the pedestal 32. The processor 85 controls the pedestal lift system, motors, gate valve, plasma system, and other system components over control lines 3 and 3A–C. The processor 85 may execute computer code for controlling the apparatus. A memory 86 coupled to the processor 85 may store the computer code. The processor 85 may also control a remote plasma system 4. In some embodiments, the remote plasma system 4 may include a microwave source and may be used to form a plasma that can be used to clean the process chamber 30 or process the wafer 36. Computer code may be used to control chamber components that may be used to load the wafer 36 onto the pedestal 32, lift the wafer 36 to a desired height in the chamber 30, control the spacing between the wafer 36 and the showerhead 40, and keep the lift pins 38 above the upper surface of the pedestal 32.

EXAMPLE

An eight-inch semiconductor wafer including a copper layer is placed on pins extending through a wafer pedestal disposed in a plasma processing chamber in a Centura DxZ CVD apparatus. This apparatus is commercially available from Applied Materials, Inc. of Santa Clara, Calif. The pins are stationary and a heater moves and is spaced about 1000 mils (thousandths of an inch) from the showerhead. The wafer pedestal is heated to 400° C. and is maintained at this temperature while the semiconductor wafer is in the processing chamber. Once the semiconductor wafer is on the pins, the processing chamber is pumped down to 4.2 Torr and is maintained at this pressure while the semiconductor wafer is in the processing chamber. Argon is introduced to the processing chamber at a flowrate of about 7,500 sccm for about 10 seconds. After the argon is introduced to the plasma processing chamber, a remote plasma system is turned on. After about 5 seconds, about 300 sccm of $NH_3$ is introduced to the system and a plasma is generated by the remote plasma system. The remote plasma system is a microwave plasma system and is at maximum power (5000 W). The ionized $NH_3$ molecules remove the copper oxide at the surface of the copper layer. This process takes about 20 seconds.

Then, the flow of argon and $NH_3$ is terminated. Nitrogen is introduced to the plasma processing apparatus at about 5000 sccm. After the nitrogen is introduced for about 5 to about 10 seconds, power at about 555 W is applied to the processing chamber for about 5 seconds. A plasma is formed from the nitrogen. The spacing between the pedestal and the showerhead is then reduced to about 550 mils. As the pedestal moves, the wafer is lifted off of the ends of the lifting pins and the wafer rests on the pedestal.

The pedestal then heats the wafer to about 400° C, the process temperature for silicon nitride deposition. The nitrogen flow is maintained at about 5000 sccm and silane is introduced into the plasma processing apparatus at a flow rate of about 110 sccm. A plasma is formed in the processing chamber from the silane and the nitrogen gas as power at 555 W is applied to the processing chamber. After about 15 to 17 seconds, a silicon nitride layer is deposited on the copper layer on the semiconductor substrate. After the silicon nitride layer is formed, the substrate is transferred to an evacuated load-lock coupled to processing chamber. The load-lock is pressurized and the semiconductor substrate is removed from the load-lock and is examined. No evidence of hillocks is observed in the silicon nitride layer.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method for processing a substrate in a processing chamber in a processing apparatus, the method comprising:
   (a) placing a substrate in the processing chamber, wherein a first layer comprising a conductive material and an oxide layer are on the substrate;
   (b) removing the oxide layer while the substrate is at a first temperature in the processing chamber; and
   (c) forming a second layer on the first layer while the substrate is at a second temperature in the processing chamber, wherein the second temperature is different than the first temperature,
   wherein the substrate is spaced from a pedestal within the processing chamber during (b) and is in contact with the pedestal during (c).

2. The method of claim 1 wherein the second temperature is higher than the first temperature.

3. The method of claim 1 wherein the substrate is a semiconductor substrate and the conductive material comprises copper.

4. The method of claim 1 further comprising:
   forming a plasma from an inert gas prior to (c).

5. The method of claim 1 wherein the substrate is spaced from the pedestal by using lift pins that extend from the pedestal.

6. The method of claim 1 wherein the processing apparatus is a plasma processing apparatus.

7. The method of claim 1 wherein the second temperature is at least about 50° C, higher than the first temperature.

8. The method of claim 1 wherein (b) comprises:
   introducing a reducing gas into the processing chamber.

9. The method of claim 1 wherein (b) comprises:
   introducing a reducing gas derived from $NH_3$ or $H_2$ into the processing chamber.

10. The method of claim 1 wherein the processing apparatus includes a pedestal including a heating element, wherein the pedestal is maintained at the second temperature during (b) and (c).

11. The method of claim 1 wherein removing the oxide layer comprises generating a remote plasma, and using the remote plasma to remove the oxide layer.

12. The method of claim 1 wherein the second layer is a barrier layer.

13. The method of claim 1 wherein the second layer is a dielectric layer.

14. The method of claim 1 wherein (b) and (c) are performed in sequence while the chamber is maintained at low pressure.

15. A method for processing a substrate in a plasma processing apparatus, the method comprising:
   (a) forming a remote plasma outside of a processing chamber in the plasma processing apparatus; and
   (b) performing a first process on a substrate in the plasma processing chamber using the remote plasma; and
   (c) performing a second process on the substrate in the plasma processing chamber,
   wherein the substrate is spaced from a pedestal within the processing chamber during (b) and is it contact with the pedestal during (c).

16. The method of claim 15 wherein the first process comprises an oxide removal process.

17. The method of claim 15 wherein the remote plasma is formed using a reducing gas.

18. A method for processing a substrate in a processing chamber in a processing apparatus, the method comprising:
   (a) placing a substrate in the processing chamber;
   (b) performing a first process on a substrate in the processing chamber while the substrate is at a first temperature and is spaced from a pedestal comprising a heating or a cooling element; and
   (c) performing a second process on the substrate while the substrate is at a second temperature and is on the pedestal.

19. The method of claim 18 wherein the processing apparatus is a plasma processing apparatus.

20. The method of claim 18 wherein the pedestal comprises the heating element.

21. The method of claim 18 wherein (c) is performed before (b).

22. The method of claim 18 wherein the first process comprises an oxide removal process and the second process comprises a deposition process.

23. The method of claim 18 wherein the substrate is spaced from the pedestal using pins.

24. The method of claim 18 further comprising:
   decreasing the spacing between the substrate and the pedestal between (b) and (c).

25. The method of claim 19 further comprising:
   increasing the spacing between the substrate and the pedestal between (b) and (c).

26. A method for processing a substrate in a processing chamber in a plasma processing apparatus, the method comprising:
   (a) placing a substrate in the processing chamber, wherein a conducting layer and an oxide layer are on the substrate;
   (b) removing the oxide layer while the substrate is at a first temperature and is disposed above a pedestal comprising a heating element; and
   (c) moving the substrate until the substrate contacts the pedestal at a second temperature that is higher than the first temperature; and
   (d) depositing a dielectric layer on the conducting layer.

27. The method of claim 26 wherein, in (b), the substrate is disposed on lift pins that extend through the pedestal.

28. The method of claim 26 wherein in (d), the substrate is in contact with the pedestal.

29. The method of claim 26 wherein the conducting layer comprises copper, the dielectric layer comprises silicon nitride, and the oxide layer comprises copper oxide.

30. The method of claim 26 wherein (b) comprises introducing a reducing gas derived from $NH_3$ or $H_2$ into the processing chamber.

31. The method of claim 26 wherein each of (b) and (d) comprises forming a plasma.

* * * * *